US009705018B2

(12) United States Patent
Nakagawa et al.

(10) Patent No.: US 9,705,018 B2
(45) Date of Patent: Jul. 11, 2017

(54) PHOTOELECTRIC CONVERSION ELEMENT, METHOD FOR MANUFACTURING PHOTOELECTRIC CONVERSION ELEMENT, AND SOLAR CELL

(71) Applicant: KABUSHIKI KAISHA TOSHIBA, Minato-ku, Tokyo (JP)

(72) Inventors: Naoyuki Nakagawa, Tokyo (JP); Soichiro Shibasaki, Tokyo (JP); Hiroki Hiraga, Kanagawa (JP); Mutsuki Yamazaki, Kanagawa (JP); Kazushige Yamamoto, Kanagawa (JP); Shinya Sakurada, Tokyo (JP); Michihiko Inaba, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 369 days.

(21) Appl. No.: 14/085,433

(22) Filed: Nov. 20, 2013

(65) Prior Publication Data

US 2014/0144502 A1    May 29, 2014

(30) Foreign Application Priority Data

Nov. 20, 2012  (JP) .................................. 2012-254435

(51) Int. Cl.
*H01L 31/032*  (2006.01)
*H01L 31/068*  (2012.01)

(52) U.S. Cl.
CPC ...... *H01L 31/0322* (2013.01); *H01L 31/0323* (2013.01); *H01L 31/068* (2013.01);
(Continued)

(58) Field of Classification Search
CPC .......................... H01L 31/068; H01L 31/0322
(Continued)

(56) References Cited

U.S. PATENT DOCUMENTS

2004/0063320 A1\* 4/2004 Hollars ............... C23C 14/0057
  438/689
2009/0242029 A1    10/2009 Paulson et al.
(Continued)

FOREIGN PATENT DOCUMENTS

JP      07-258881       10/1995
JP      10-074968        3/1998
(Continued)

OTHER PUBLICATIONS

Norsworthy, et al. "CIS film growth by metallic ink coating and selenization", Solar Energy Materials and Solar Cells 60 (2000) 127-134.*

*Primary Examiner* — Allison Bourke
(74) *Attorney, Agent, or Firm* — Amin, Turocy & Watson LLP

(57) ABSTRACT

A photoelectric conversion element of an embodiment includes: a back electrode; a heterojunction-type light absorbing layer on the back electrode, containing Cu, selected from Al, In and Ga, and selected from Se and S, and having a chalcopyrite structure; a transparent electrode on the light absorbing layer, wherein aback electrode side-part of the light absorbing layer is of p-type, and a transparent electrode-side part of the light absorbing layer is of n-type, the light absorbing layer has a part with an average crystal grain size of 1,000 nm to 3,000 nm in the vicinity of the back electrode, and the light absorbing layer has apart with an average crystal grain size of at most 500 nm in the vicinity of the transparent electrode or the light absorbing layer has an amorphous part in the vicinity of the transparent electrode.

18 Claims, 2 Drawing Sheets

(52) U.S. Cl.
CPC ........... *Y02E 10/541* (2013.01); *Y02E 10/547* (2013.01); *Y02P 70/521* (2015.11)

(58) Field of Classification Search
USPC .......................................................... 136/265
See application file for complete search history.

(56) References Cited

U.S. PATENT DOCUMENTS

| | | | | |
|---|---|---|---|---|
| 2011/0308616 | A1* | 12/2011 | Kamada | H01L 31/0322 136/262 |
| 2012/0103418 | A1* | 5/2012 | Chung | H01L 31/02168 136/262 |
| 2013/0099226 | A1* | 4/2013 | Kamada | H01L 31/0322 257/42 |
| 2013/0244370 | A1 | 9/2013 | Tadakuma | |
| 2014/0026956 | A1 | 1/2014 | Chirila et al. | |
| 2014/0083496 | A1 | 3/2014 | Shibasaki et al. | |
| 2014/0366944 | A1 | 12/2014 | Miyamichi et al. | |

FOREIGN PATENT DOCUMENTS

| | | |
|---|---|---|
| JP | 2003-179237 | 6/2003 |
| JP | 2003-298091 | 10/2003 |
| JP | 2005-228975 | 8/2005 |
| JP | 2005-303201 | 10/2005 |
| JP | 2008-235794 | 10/2008 |
| JP | 2011-515867 | 5/2011 |
| JP | 2012-104575 | 5/2012 |
| JP | 2012-182177 | 9/2012 |
| JP | 2014-082456 | 5/2014 |
| WO | 2011/040272 A1 | 4/2011 |
| WO | 2011/108033 A1 | 9/2011 |
| WO | 2012/143858 A1 | 10/2012 |
| WO | 2013/111495 A1 | 8/2013 |

\* cited by examiner

PHOTOELECTRIC CONVERSION ELEMENT, METHOD FOR MANUFACTURING PHOTOELECTRIC CONVERSION ELEMENT, AND SOLAR CELL

CROSS-REFERENCE TO RELATED APPLICATION

This application is based upon and claims the benefit of priority from Japanese Patent Application No. 2012-254435 Nov. 20, 2012; the entire contents of which are incorporated herein by reference.

FIELD

Embodiments described herein relate generally to a photoelectric conversion element, a method for manufacturing a photoelectric conversion element, and a solar cell.

BACKGROUND

Compound photoelectric conversion elements having a semiconductor thin film as a light absorbing layer have been developed. In particular, photoelectric conversion elements having, as a light absorbing layer, a p-type semiconductor layer with a chalcopyrite structure have high conversion efficiency and thus promising applications. Specifically, photoelectric conversion elements having a light absorbing layer of $Cu(In,Ga)Se_2$ as a Cu—In—Ga—Se (CIGS) compound have relatively high conversion efficiency. The conversion efficiency η is expressed by η=Voc·Jsc·FF/P·100, wherein Voc is open circuit voltage, Jsc is short-circuit current density, FF is fill factor, and P is incident power density.

A photoelectric conversion element has a p-type semiconductor layer of Cu—In—Ga—Se as a light absorbing layer. Such a photoelectric conversion element generally has a structure including a blue sheet glass substrate, and a Mo back electrode, a p-type semiconductor layer, an n-type semiconductor layer, an insulating layer, a transparent electrode, an upper electrode, and an anti-reflection film, which are stacked on the substrate. A high-efficiency CIGS solar cell has a p-type semiconductor layer of CIGS and an n-type semiconductor layer of CdS, which form a pn junction. Unfortunately, such a solar cell is not considered to provide sufficient performance due to its heterojunction structure and light absorption at the n-CdS layer. A technique proposed to avoid such a problem is a homojunction structure having, instead of the n-CdS layer, a layer manufactured by n-type doping of part of a p-CIGS layer in the vicinity of a transparent electrode. However, n-type doping of a highly-crystalline p-CIGS layer is difficult. On the other hand, doping of a p-CIGS layer with low crystallinity is easy, but as its crystallinity decreases, bulk recombination occurs to reduce the cell efficiency.

DETAILED DESCRIPTION

A photoelectric conversion element of an embodiment includes: aback electrode; a homojunction-type light absorbing layer on the back electrode, containing Cu, selected from An, In and Ga, and selected from Se and S, and having a chalcopyrite structure; and a transparent electrode on the light absorbing layer, wherein aback electrode side-part of the light absorbing layer is of p-type, and a transparent electrode-side part of the light absorbing layer is of n-type, the light absorbing layer has a part with an average crystal grain size of 1,000 nm to 3,000 nm in the vicinity of the back electrode, and the light absorbing layer has a part with an average crystal grain size of at most 500 nm in the vicinity of the transparent electrode or the light absorbing layer has an amorphous part in the vicinity of the transparent electrode.

Embodiments will be described below with reference to the drawings.

Hereinafter, embodiments will be described by way of example with reference to the drawings.

(Photoelectric Conversion Element)

Figure 1:
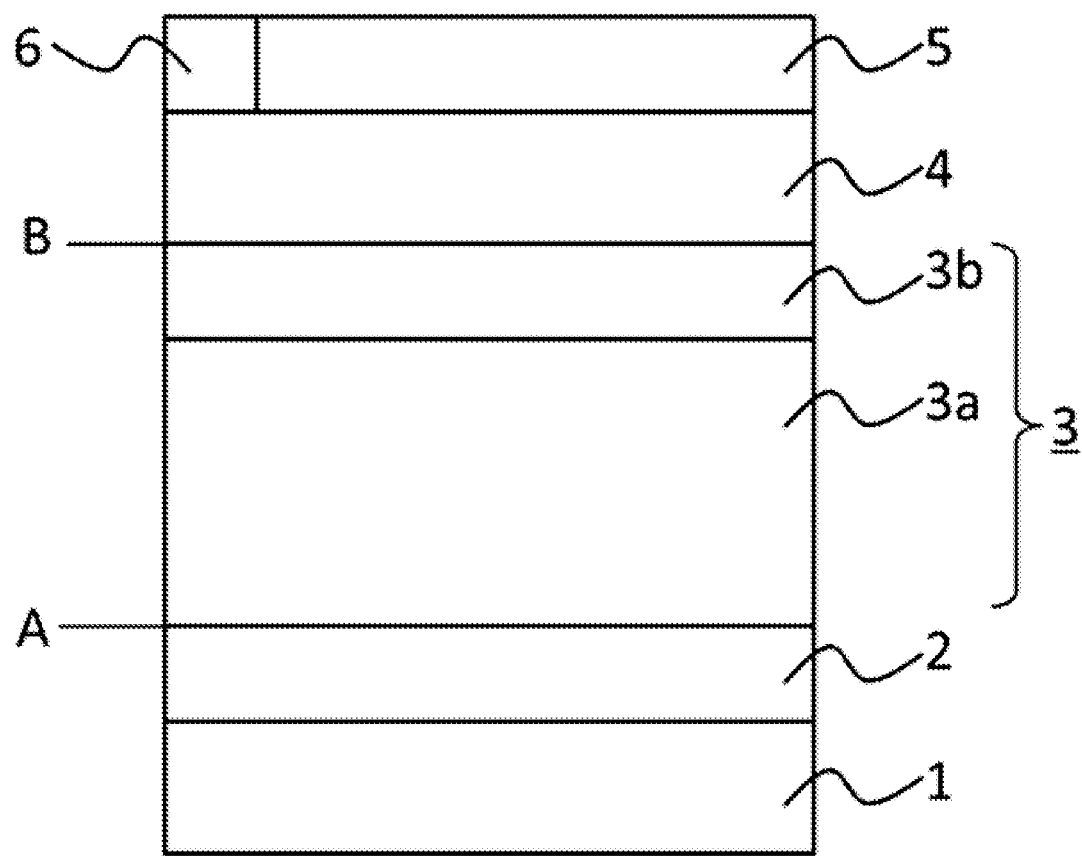
FIG. 1 is a schematic cross-sectional view of a photoelectric conversion element according to an embodiment.
Figure 2:
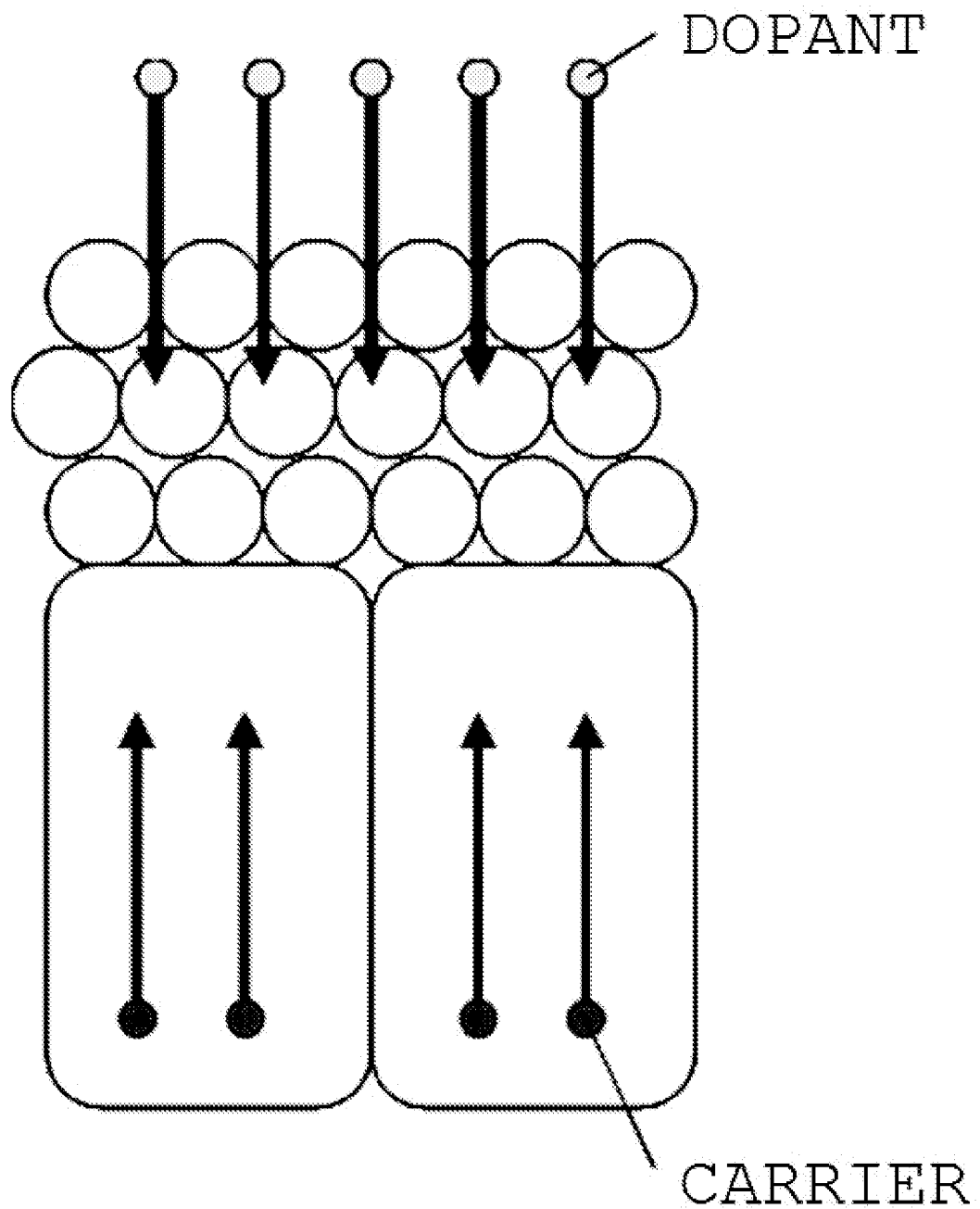
FIG. 2 is a schematic diagram concerning the grain size of a light absorbing layer used in a photoelectric conversion element according to an embodiment.

FIG. 1 is a schematic diagram showing a photoelectric conversion element 100 according to an embodiment. The photoelectric conversion element 100 includes a substrate 1, a back electrode 2 formed on the substrate 1, a light absorbing layer 3 including a p-type semiconductor layer 3a formed on the back electrode 2 and an n-type semiconductor layer 3b forming a homojunction with the p-type semiconductor layer 3a, a transparent electrode 4 formed on the light absorbing layer 3, an upper electrode 5 formed on the transparent electrode 4, and an anti-reflection film 6 formed on transparent electrode 4. The light absorbing layer 3 has the p-type semiconductor layer 3a on the back electrode 2 side of the light absorbing layer 3 and the n-type semiconductor layer 3b on the transparent electrode 4 side of the light absorbing layer 3.

(Substrate)

In an embodiment, blue sheet glass is preferably used as the substrate 1, while a sheet of metal such as stainless steel, Ti, or Cr or resin such as polyimide may also be used as the substrate 1.

(Back Electrode)

In an embodiment, the back electrode 2, which is an electrode of the photoelectric conversion element 100, is a metal film formed on the substrate 1. A film of electrically conductive metal such as Mo or W may be used as the back electrode 2. In particular, a Mo film is preferably used as the back electrode 2. The back electrode 2 can be formed as a film by sputtering or other techniques on the substrate 1. The back electrode 2 typically has a thickness of 500 nm to 1,000 nm.

(Light Absorbing Layer)

In an embodiment, the light absorbing layer 3 is a photoelectric conversion layer of the photoelectric conversion element 100. The light absorbing layer 3 is a semiconductor layer including a p-type compound semiconductor layer 3a and an n-type compound semiconductor layer 3b, which form a homojunction. A compound semiconductor layer with a chalcopyrite structure containing elements of groups Ib, IIIb, and VIb, such as a CIGS CAGS or CIT structure may be used as the light absorbing layer 3. The group Ib element is preferably Cu. The group IIIb element is preferably at least one element selected from the group consisting of Al, In, and Ga, and more preferably includes In or Al. The group VIb element is preferably at least one element selected from the group consisting of O, S, Se, and Te, and more preferably includes Se. In is more preferably used as the group IIIb element because the use of In in combination with Ga makes it easy to adjust the band gap to the desired level. In is preferably that using Al in combination with Ga as the group IIIb element makes it possible to adjust the wide band gap which matches a band gap for small wavelength.

Specifically, the light absorbing layer 3 may be made of a compound semiconductor such as $Cu(In,Ga)(S,Se)_2$, $Cu(In,Ga)(Se,Te)_2$, $Cu(In,Ga)_3(Se,Te)_5$, $Cu(Al,Ga,In)Se_2$, or $Cu_2ZnSnS_4$, and more specifically made of $Cu(In,Ga)Se_2$, $CuInSe_2$, $CuInTe_2$, $Cu(Al,Ga)Se_2$, $CuGaSe_2$, or $CuIn_3Te_5$. A compound composed of elements present in the back electrode 2 and the light absorbing layer 3 preferably exists between them.

In an embodiment, the light absorbing layer 3 is of a homojunction type, having a p-type compound semiconductor on the back electrode 2 side and an n-type compound semiconductor on the transparent electrode 4 side. The light absorbing layer 3 typically has a thickness of 2,000 nm to 3,000 nm. For example, the p-type region 3a preferably has a thickness of 1,500 nm to 2,500 nm, and the n-type region 3b preferably has a thickness of 50 nm to 500 nm.

The thickness of the region and the pn interface vary with the doping process for conversion to the n-type. Therefore, the crystals of the p-type compound semiconductor in the vicinity of the back electrode 2 and the crystals of the n-type compound semiconductor in the vicinity of the transparent electrode 4 will be described below. Hereinafter, for the sake of convenience, the average crystal grain size of apart in the vicinity of the back electrode 2, generally, the average crystal grain size of the p-type compound semiconductor in the light absorbing layer 3a in the vicinity of the back electrode 2 is called the p-layer average crystal grain size. Hereinafter, for the sake of convenience, the average crystal grain size of apart in the vicinity of the transparent electrode 4, generally, the average crystal grain size of the n-type compound semiconductor in the light absorbing layer 3b in the vicinity of the transparent electrode 4 is called the n-layer average crystal grain size, when the light absorbing layer 3b is not amorphous. In this case, the p-layer average crystal grain size is preferably larger than the n-layer average crystal grain size.

In this case, the part in the vicinity of the back electrode 2 may be defined as a region from the interface A between the back electrode 2 and the light absorbing layer 3a to a depth of 50 nm into the light absorbing layer 3a, and the crystal grain sizes may be defined as the sizes of crystals at least part of which are present in the region. The part in the vicinity of the transparent electrode 4 may be defined as a site 50 nm apart from the interface B between the transparent electrode 4 and the light absorbing layer 3b into the light absorbing layer 3b, and the crystal grain sizes may be defined as the sizes of crystals at the site. If the thickness of the n-type region is less than 50 nm, the thickness of the part of the n-type compound semiconductor in the vicinity of the transparent electrode 4 may be reduced as desired.

When the part in the vicinity of the back electrode 2, specifically, the p-type compound semiconductor forms large grain size crystals, carriers can easily move to provide high conversion efficiency, which is preferred. The p-layer average crystal grain size is from 1,000 nm to 3,000 nm. The average crystal grain size of the p-type compound semiconductor is also preferably from 1,000 nm to 3,000 nm. When the p-layer average crystal grain size is 1,500 nm or less, photocarriers generated in the bulk can be prevented from being recombined before they reach the light absorbing layer 3b and the transparent electrode 4, and further the upper electrode 5, which is advantageous in that high conversion efficiency can be achieved. When the p-layer average crystal grain size is 2,500 nm or less, the diffusion of the n-type dopant can be less inhibited in the process of forming the n-type compound semiconductor, which is advantageous in that the conversion to the n-type can be made easy.

On the other hand, when the site in the vicinity of the transparent electrode 4, specifically, the n-type compound semiconductor forms small grain size crystals or is amorphous, the p-type compound semiconductor can absorb an increased amount of light in the long wavelength region, which is preferred. Thus, the n-layer average crystal grain size is preferably 500 nm or less (small grain size crystals), or the n-layer is preferably amorphous. When the n-type compound semiconductor forms small grain size crystals or is amorphous, incident light can be scattered at the site in the vicinity of the transparent electrode 4, mainly, at the n-type compound semiconductor of the light absorbing layer 3b, so that the light path length can increase, which is advantageous in that the p-type compound semiconductor of the light absorbing layer 3a can absorb an increased amount of long-wavelength light. For the above reason, the small grain size crystals more preferably have an average crystal grain size of 200 nm or less. In some cases, an amorphous material and small grain size crystals coexist in the vicinity of the transparent electrode 4.

Next, it will be described how to manufacture the light absorbing layer 3 according to an embodiment.

In an embodiment, the light absorbing layer 3 is obtained by a process that includes forming a p-type semiconductor layer as a precursor on the back electrode 2 and converting a region of the p-type semiconductor layer into an n-type layer, wherein the region is on the side where the transparent electrode 4 is to be formed. The method of forming the p-type semiconductor layer may be a thin-film forming method such as a vapor deposition method (three-stage method) including a rapid cooling step between its second and third stages, or a sputtering method. In an embodiment, the three-stage method includes depositing a group IIIb element and a group VIb element, then depositing a group Ib element and a group VIb element at a high temperature, then performing rapid cooling, and then depositing the group IIIb element and the group VIb element again at a low temperature to form the light absorbing layer 3. The group Ib element is preferably Cu. The group IIIb element is preferably at least one element selected from the group consisting of Al, In, and Ga, and more preferably includes In or Al. The group VIb element is preferably at least one element selected from the group consisting of O, S, Se, and Te, and more preferably includes Se or S. A vapor deposition method will be described below as a production method. Alternatively, a sputtering method may be used to form the light absorbing layer 3 according to an embodiment. In this case, for example, the method may include forming a film, under low-temperature conditions, at the region to be in the vicinity of the transparent electrode 4.

In a vapor deposition method (three-stage method), first, the substrate (a member composed of the substrate 1 and the back electrode 2 formed thereon) is heated to a temperature of 200° C. to 400° C., and a group IIIb element and a group VIb element are deposited thereon (first stage).

Subsequently, the substrate is heated to a temperature of 450° C. to 550° C., and Cu (a group Ib element) and a group VIb element such as Se are deposited. It is prefer that the depositing Ib and VIb starts at a temperature of 200° C. to 400° C. when elements selected from at least Al and further selected from In and Ga are used as a group of IIIb element. In this case, the deposited elements at first stage are easy to re-evaporate if Ib and VIb depositing starts at high temperature (450° C. to 550° C.) More preferable starting temperature at second stage is equal to the temperature at first stage or more. The start of an endothermic reaction is checked, and the deposition of the group Ib element Cu is stopped once when the composition has an excess of the group Ib element Cu (second stage).

Immediately after the deposition is stopped, the substrate is rapidly cooled by natural cooling or by locally spraying an inert gas such as nitrogen or argon, so that the substrate is cooled to a temperature of 400° C. or lower. After the rapid cooling, a group IIIb element and a group VIb element are deposited again (third stage) to form a composition with a slight excess of a group IIIb element such as Al, In or Ga.

The back electrode 2-side part of the light absorbing layer 3 has large grain size crystals because it is formed at high temperature. On the other hand, the rapid cooling after the completion of the second-stage deposition allows the transparent electrode 4-side part of the light absorbing layer 3 to have small grain sizes or to be amorphous. In addition, the rapid cooling followed by the third-stage deposition at low temperature can suppress the diffusion of the group Ib element Cu, so that the transparent electrode 4-side part of the light absorbing layer 3 can contain many Cu vacancies as compared with when the rapid cooling is not performed. When n-type doping is performed on the product with many Cu vacancies, a large amount of the n-type dopant can enter the Cu vacancy sites, which is advantageous in that an n-type-dopant-rich n-type semiconductor can function. After the p-type semiconductor layer is formed, part of the p-type semiconductor layer can be converted from the p-type to the n-type by liquid-phase doping with a solution containing an n-type dopant such as Cd or Zn (for example, cadmium sulfate). When part of the p-type semiconductor layer is converted into the n-type, a homojunction-type light absorbing layer 3 is formed, which has a homojunction between the p-layer 3a and the n-layer 3b. The doping process may be performed in such a manner that the concentration of the n-dopant is higher on the side where the transparent electrode 4 is to be formed. The doping with the n-dopant is preferably followed by washing off the dopant with water before the next step is performed.

The average crystal grain size of the light absorbing layer 3 can be determined from a TEM image of a cross-section of the photoelectric conversion element. The cross-sectional image can be obtained by the transmission electron microscope (TEM) observation of the cross-section. Crystals at a depth of around 50 nm from the interface A between the light absorbing layer 3a and the back electrode 2 into the light absorbing layer 3a are observed in a 4 µm wide image obtained by the cross-sectional TEM observation at a magnification of 40,000×. The area of each crystal is used to calculate the diameter of a perfect circle corresponding to the area. Assuming that the diameter is the crystal grain size, the average crystal grain size of the light absorbing layer 3a is calculated. The average crystal grain size of the light absorbing layer 3b is calculated in the same manner using a 4 µm wide image obtained by 40,000× cross-sectional TEM observation at a depth of around 50 nm from the interface B between the light absorbing layer 3b and the transparent electrode 4 into the light absorbing layer 3b. Some cross-sectional TEM images only show the end parts of crystals and do not reflect the size of crystals themselves. Thus, crystals whose calculated diameters are less than 1/10 of the median value of the calculated crystal diameters should be excluded from the calculation of the average crystal grain size.

Whether the site in the vicinity of the transparent electrode 4 is amorphous can be checked by electron diffraction. The electron diffraction from the crystalline site produces a spot pattern, whereas the electron diffraction from the amorphous site produces a ring pattern, which enables the identification of crystallinity.

(Transparent Electrode)

In an embodiment, the transparent electrode 4 is a film electrically conductive and transparent for light such as sunlight. For example, the transparent electrode 4 can be formed using ZnO:Al containing 2 wt % of alumina ($Al_2O_3$) or using ZnO:B containing B as a dopant derived from diborane. A semi-insulating layer, such as an i-ZnO layer, serving as a protective layer may also be formed, for example, with a thickness of 20 nm to 100 nm between the transparent electrode 4 and the light absorbing layer 3. The transparent electrode 4 can be formed by sputtering or other deposition techniques.

(Upper Electrode)

In an embodiment, the upper electrode 5, which is an electrode of the photoelectric conversion element, is a metal film formed on the transparent electrode 4. The upper electrode 5 can be formed using Al, Ag, Au, or other metals. Al, Ag, Au, or other metals may be deposited on a Ni or Cr film formed on the transparent electrode 4 by deposition so that the adhesion of the upper electrode to the transparent electrode 4 can be increased. The upper electrode 5 typically has a thickness of 300 nm to 1,000 nm. For example, the upper electrode 5 can be deposited by resistance heating vapor deposition method.

(Anti-Reflection Film)

In an embodiment, the anti-reflection film 6 is a film provided to facilitate the introduction of light into the light absorbing layer 3. The anti-reflection film 6 is formed on the transparent electrode 4. For example, the anti-reflection film 6 is preferably made of $MgF_2$. The anti-reflection film 6 typically has a thickness of 90 nm to 120 nm. For example, the anti-reflection film 6 can be formed by electron beam vapor deposition method.

Hereinafter, the present disclosure will be more specifically described with reference to examples.

Example 1

Blue sheet glass was used as the substrate 1, and a Mo thin film with a thickness of about 700 nm was deposited as the back electrode 2 by sputtering on the substrate 1. The sputtering was performed in an Ar gas atmosphere under application of 200 W RF using Mo as a target. After the Mo thin film was deposited as the back electrode 2, a Cu(In, Ga)$Se_2$ thin film was formed as the light absorbing layer 3 by vapor deposition method (three-stage method). First, the substrate was heated to a temperature of 300° C., and In, Ga, and Se were deposited (first stage). Subsequently, the substrate was heated to a temperature of 500° C., and Cu and Se were deposited. The start of an endothermic reaction was checked, and the deposition of Cu was stopped once when the composition had an excess of Cu (second stage). Immediately after the deposition was stopped, the substrate was rapidly cooled to a temperature of 400° C. by natural cooling. After the rapid cooling, In, Ga, and Se were deposited again (third stage) to form a composition with a slight excess of a group IIIb element such as In or Ga. The light absorbing layer 3 was formed with a thickness of about 2,500 nm, and the small grain size layer was formed with a thickness of about 200 nm.

The product obtained after the deposition of the light absorbing layer 3 was immersed in a 0.8 mM cadmium sulfate solution and allowed to react at 80° C. for 22 minutes so that part of the light absorbing layer 3 was converted into an n-type layer. Thus, an n-type semiconductor layer 3b doped with Cd was formed with a thickness of about 100 nm as the light absorbing layer 3b on the front side. A semi-insulating layer of an i-ZnO thin film serving as a protective film was deposited on the n-type semiconductor layer 3b by spin coating. Subsequently, ZnO:Al containing 2 wt % of alumina ($Al_2O_3$) serving as the transparent electrode 4 was deposited with a thickness of about 1 μm on the protective film. Al was further deposited as the upper electrode 5 by resistance heating. The Al thickness was about 300 nm. Finally, a $MgF_2$ film with a thickness of about 100 nm was deposited as the anti-reflection film 6 by electron beam vapor deposition method. Thus, the photoelectric conversion element 100 of the embodiment was obtained.

The average crystal grain size of the light absorbing layers 3a and 3b and the thickness of the light absorbing layer 3b of the resulting photoelectric conversion element 100 were measured. The average crystal grain size was determined from a cross-sectional TEM image by the method described above. The thickness of the light absorbing layer 3b was the average thickness of the small grain size crystal region or the amorphous region, which was determined by the observation of the cross-sectional TEM image used in the determination of the average crystal gain size.

The open end voltage (Voc), the short-circuit current density (Jsc), and the fill factor (FF) were measured to calculate the conversion efficiency (η). A voltage source and a multimeter were used under simulated sunlight AM 1.5 applied from a solar simulator. While the voltage from the voltage source was changed, the voltage at which the current was 0 mA under the simulated sunlight was measured to obtain the open end voltage (Voc). The current was measured when no voltage was applied, so that the short-circuit current density (Jsc) was obtained.

The thickness of the light absorbing layer 3b can also be estimated from the diffusion length of the n-type dopant using secondary ion mass spectrometry (SIMS).

Example 2

A photoelectric conversion element was prepared using the same process as in Example 1, except that the deposition temperature was 200° C. at the third stage after the rapid cooling in the production of the light absorbing layer 3. The average crystal grain size, the layer thickness, and the conversion efficiency were also determined as in Example 1.

Example 3

A photoelectric conversion element was prepared using the same process as in Example 1, except that the deposition temperature was room temperature at the third stage after the rapid cooling in the production of the light absorbing layer 3. The average crystal grain size, the layer thickness, and the conversion efficiency were also determined as in Example 1.

Example 4

A photoelectric conversion element was prepared using the same process as in Example 1, except that the small grain size layer in the light absorbing layer 3 had a thickness of 500 nm. The average crystal grain size, the layer thickness, and the conversion efficiency were also determined as in Example 1.

Example 5

A photoelectric conversion element was prepared using the same process as in Example 2, except that the small grain size layer in the light absorbing layer 3 had a thickness of 500 nm. The average crystal grain size, the layer thickness, and the conversion efficiency were also determined as in Example 1.

Example 6

A photoelectric conversion element was prepared using the same process as in Example 3, except that the small grain size layer in the light absorbing layer 3 had a thickness of 500 nm. The average crystal grain size, the layer thickness, and the conversion efficiency were also determined as in Example 1.

Example 7

Blue sheet glass was used as the substrate 1, and a Mo thin film with a thickness of about 700 nm was deposited as the back electrode 2 by sputtering on the substrate 1. The sputtering was performed in an Ar gas atmosphere under application of 200 W RF using Mo as a target. After the Mo thin film was deposited as the back electrode 2, a Cu(Al, Ga)$Se_2$ thin film was formed as the light absorbing layer 3 by vapor deposition method (three-stage method). First, the substrate was heated to a temperature of 300° C., and Al, Ga, and Se were deposited (first stage). Subsequently, the substrate was heated to a temperature of 500° C. from low temperature with depositing Cu and Se. It is prefer that Cu and Se depositing starts at low temperature because the elements of Al, Ga and Se which are deposited at first stage re-evaporate if Cu and Se depositing starts at high temperature, for example 500° C. The start of an endothermic reaction was checked, and the deposition of Cu was stopped once when the composition had an excess of Cu (second stage). Immediately after the deposition was stopped, the substrate was rapidly cooled to a temperature of 400° C. by natural cooling. After the rapid cooling, Al, Ga, and Se were deposited again (third stage) to forma composition with a slight excess of a group IIIb element such as In or Ga. The light absorbing layer 3 was formed with a thickness of about 2,500 nm, and the small grain size layer was formed with a thickness of about 200 nm.

The product obtained after the deposition of the light absorbing layer 3 was immersed in a 0.8 mM cadmium sulfate solution and allowed to react at 80° C. for 22 minutes so that part of the light absorbing layer 3 was converted into an n-type layer. Thus, an n-type semiconductor layer 3b doped with Cd was formed with a thickness of about 100 nm as the light absorbing layer 3b on the front side. A semi-insulating layer of an i-ZnO thin film serving as a protective film was deposited on the n-type semiconductor layer 3b by spin coating. Subsequently, ZnO:Al containing 2 wt % of alumina ($Al_2O_2$) serving as the transparent electrode 4 was deposited with a thickness of about 1 μm on the protective film. Al was further deposited as the upper electrode 5 by resistance heating. The Al thickness was about 300 nm. Finally, a $MgF_2$ film with a thickness of about 100 nm was deposited as the anti-reflection film 6 by electron beam vapor deposition method. Thus, the photoelectric conversion element 100 of the embodiment was obtained.

The average crystal grain size of the light absorbing layers 3a and 3b and the thickness of the light absorbing layer 3b of the resulting photoelectric conversion element 100 were measured. The average crystal grain size was determined from a cross-sectional TEM image by the method described above. The thickness of the light absorbing layer 3b was the average thickness of the small grain size crystal region or the amorphous region, which was determined by the observation of the cross-sectional TEM image used in the determination of the average crystal gain size.

The open end voltage (Voc), the short-circuit current density (Jsc), and the fill factor (FF) were measured to calculate the conversion efficiency (η). A voltage source and a multimeter were used under simulated sunlight AM 1.5 applied from a solar simulator. While the voltage from the voltage source was changed, the voltage at which the current was 0 mA under the simulated sunlight was measured to obtain the open end voltage (Voc). The current was measured when no voltage was applied, so that the short-circuit current density (Jsc) was obtained.

The thickness of the light absorbing layer 3b can also be estimated from the diffusion length of the n-type dopant using SIMS.

Example 8

A photoelectric conversion element was prepared using the same process as in Example 7, except that the deposition temperature was 200° C. at the third stage after the rapid cooling in the production of the light absorbing layer 3. The average crystal grain size, the layer thickness, and the conversion efficiency were also determined as in Example 7.

Example 9

A photoelectric conversion element was prepared using the same process as in Example 7, except that the deposition temperature was room temperature at the third stage after the rapid cooling in the production of the light absorbing layer 3. The average crystal grain size, the layer thickness, and the conversion efficiency were also determined as in Example 7.

Example 10

A photoelectric conversion element was prepared using the same process as in Example 7, except that the small grain size layer in the light absorbing layer 3 had a thickness of 500 nm. The average crystal grain size, the layer thickness, and the conversion efficiency were also determined as in Example 7.

Example 11

A photoelectric conversion element was prepared using the same process as in Example 9, except that the small grain size layer in the light absorbing layer 3 had a thickness of 500 nm. The average crystal grain size, the layer thickness, and the conversion efficiency were also determined as in Example 7.

Example 12

A photoelectric conversion element was prepared using the same process as in Example 9, except that the small grain size layer in the light absorbing layer 3 had a thickness of 500 nm. The average crystal grain size, the layer thickness, and the conversion efficiency were also determined as in Example 7.

Comparative Example 1

A photoelectric conversion element was prepared using the same process as in Example 1, except that the rapid cooling was not performed in the production of the light absorbing layer 3. The average crystal grain size, the layer thickness, and the conversion efficiency were also determined as in Example 1.

Comparative Example 2

A photoelectric conversion element was prepared using the same process as in Example 1, except that the deposition temperature was 400° C. at the second stage in the production of the light absorbing layer 3 and that the rapid cooling was not performed in the production of the light absorbing layer 3. The average crystal grain size, the layer thickness, and the conversion efficiency were also determined as in Example 1.

Comparative Example 3

A photoelectric conversion element was prepared using the same process as in Example 1, except that the small grain size layer in the light absorbing layer 3 had a thickness of 700 nm. The average crystal grain size, the layer thickness, and the conversion efficiency were also determined as in Example 1.

Comparative Example 4

A photoelectric conversion element was prepared using the same process as in Example 7, except that the rapid cooling was not performed in the production of the light absorbing layer 3. The average crystal grain size, the layer thickness, and the conversion efficiency were also determined as in Example 7.

Comparative Example 5

A photoelectric conversion element was prepared using the same process as in Example 7, except that the deposition temperature was 400° C. at the second stage in the production of the light absorbing layer 3 and that the rapid cooling was not performed in the production of the light absorbing layer 3. The average crystal grain size, the layer thickness, and the conversion efficiency were also determined as in Example 7.

Comparative Example 6

A photoelectric conversion element was prepared using the same process as in Example 7, except that the small grain size layer in the light absorbing layer 3 had a thickness of 700 nm. The average crystal grain size, the layer thickness, and the conversion efficiency were also determined as in Example 7.

The conversion efficiency ($\eta = Voc \cdot Jsc \cdot FF/P \cdot 100$ [%]) of each of the photoelectric conversion elements of the examples and the comparative examples is shown in the table 1 and table 2 below. The values of the average crystal grain size and the layer thickness are rounded off to one significant figure.

TABLE 1

|  | 3a Grain Size(nm) | 3b Grain Size(nm) | 3b layer thickness(nm) | Conversion efficiency (%) |
| --- | --- | --- | --- | --- |
| Example 1 | 2000 | 200 | 200 | 15.2 |
| Example 2 | 2000 | 50 | 200 | 15.0 |
| Example 3 | 2000 | Amorphous | 200 | 14.5 |
| Example 4 | 2000 | 200 | 500 | 13.2 |

TABLE 1-continued

|  | 3a Grain Size(nm) | 3b Grain Size(nm) | 3b layer thickness(nm) | Conversion efficiency (%) |
|---|---|---|---|---|
| Example 5 | 2000 | 50 | 500 | 13.0 |
| Example 6 | 2000 | Amorphous | 500 | 12.5 |
| Comparative Example 1 | 2000 | — | — | 10.5 |
| Comparative Example 2 | 200 | — | — | 8.0 |
| Comparative Example 3 | 2000 | 200 | 700 | 5.0 |

TABLE 2

|  | 3a Grain Size(nm) | 3b Grain Size(nm) | 3b layer thickness(nm) | Conversion efficiency (%) |
|---|---|---|---|---|
| Example 7 | 2000 | 200 | 200 | 10.2 |
| Example 8 | 2000 | 50 | 200 | 10.0 |
| Example 9 | 2000 | Amorphous | 200 | 9.5 |
| Example 10 | 2000 | 200 | 500 | 8.2 |
| Example 11 | 2000 | 50 | 500 | 8.0 |
| Example 12 | 2000 | Amorphous | 500 | 7.5 |
| Comparative Example 4 | 2000 | — | — | 5.5 |
| Comparative Example 5 | 200 | — | — | 3.0 |
| Comparative Example 6 | 2000 | 200 | 700 | 1.0 |

The rapid cooling performed in the three-stage process for forming the light absorbing layer 3 made the crystal grain size of the light absorbing layer 3b small, made the n-type doping easy, and improved the conversion efficiency. When the crystal grain size of the light absorbing layer 3b was made small or when the light absorbing layer 3b was made amorphous, light scattering in the light absorbing layer 3b caused an increase in the absorption of long-wavelength light, which also contributes to the improvement of the characteristics. As is evident from Examples 4 to 6 and 10 to 12, when the thickness of the light absorbing layer 3b was up to about 500 nm relative to the n-type doping depth, the above effect contributed to the improvement of the efficiency. However, when the thickness of the light absorbing layer 3b was more than 500 nm, carrier recombination became predominant so that the efficiency decreased.

In the description, some elements are expressed only by symbols. For example, the photoelectric conversion element of the embodiment can be used as a solar cell including a photoelectric transducer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A photoelectric conversion element, comprising:
a back electrode;
a homojunction-type light absorbing layer on the back electrode, containing Cu, selected from Al, In and Ga, and selected from Se and S, and having a chalcopyrite structure; and
a transparent electrode on the light absorbing layer, wherein
the homojunction-type light absorbing layer has a p-type compound semiconductor layer and an n-type compound semiconductor layer, which form the homojunction;
a back electrode side-part of the light absorbing layer is of p-type, and a transparent electrode-side part of the light absorbing layer is of n-type,
the p-type compound semiconductor layer has a part with an average crystal grain size of 1,000 nm to 3,000 nm in a region from an interface between the back electrode and the light absorbing layer to a depth of 50 nm into the light absorbing layer, and
the n-type compound semiconductor layer has a part with an average crystal grain size of at most 500 nm at a site 50 nm apart from an interface between the transparent electrode and the light absorbing layer into the light absorbing layer or the light absorbing layer has an amorphous part at the site 50 nm apart from the interface between the transparent electrode and the light absorbing layer into the light absorbing layer.
2. The element according to claim 1, wherein the light absorbing layer has a part with an average crystal grain size of at least 1,500 nm in the region from an interface between the back electrode and the light absorbing layer to the depth of 50 nm into the light absorbing layer.
3. The element according to claim 1, wherein the light absorbing layer has a part with an average crystal grain size of at most 200 nm at the site 50 nm apart from the interface between the transparent electrode and the light absorbing layer into the light absorbing layer.
4. The element according to claim 1, wherein the n-type region has a thickness of at most 500 nm.
5. A solar cell, comprising a photoelectric conversion element at least comprising:
a back electrode;
a homojunction-type light absorbing layer on the back electrode, containing Cu, selected from Al, In and Ga, and selected from Se and S, and having a chalcopyrite structure; and
a transparent electrode on the light absorbing layer, wherein
the homojunction-type light absorbing layer has a p-type compound semiconductor layer and an n-type compound semiconductor layer, which form the homojunction;
a back electrode side-part of the light absorbing layer is of p-type, and a transparent electrode-side part of the light absorbing layer is of n-type,
the p-type compound semiconductor layer has a part with an average crystal grain size of 1,000 nm to 3,000 nm in a region from an interface between the back electrode and the light absorbing layer to a depth of 50 nm into the light absorbing layer, and
the n-type compound semiconductor layer has a part with an average crystal grain size of at most 500 nm at a site 50 nm apart from an interface between the transparent electrode and the light absorbing layer into the light absorbing layer or the light absorbing layer has an amorphous part at the site 50 nm apart from the interface between the transparent electrode and the light absorbing layer into the light absorbing layer.
6. The cell according to claim 5, wherein the light absorbing layer has a part with an average crystal grain size of at least 1,500 nm in the region from an interface between the back electrode and the light absorbing layer to the depth of 50 nm into the light absorbing layer.

7. The cell according to claim 5, wherein the light absorbing layer has a part with an average crystal grain size of at most 200 nm at the site 50 nm apart from the interface between the transparent electrode and the light absorbing layer into the light absorbing layer.

8. The cell according to claim 5, wherein the n-type region has a thickness of at most 500 nm.

9. The element according to claim 1, wherein the p-type compound semiconductor layer has an average crystal grain size of 1,000 nm to 3,000 nm.

10. The element according to claim 1, wherein the n-type compound semiconductor layer has an average crystal grain size of at most 500 nm or an amorphous.

11. The element according to claim 1, wherein
the p-type compound semiconductor layer contains Cu, selected from Al, In and Ga, and selected from Se and S,
the p-type compound semiconductor layer has a chalcopyrite structure,
the n-type compound semiconductor layer contains Cu, selected from Al, In and Ga, selected from Se and S, and selected from Cd and Zn, and
the n-type compound semiconductor layer has a chalcopyrite structure.

12. The element according to claim 1, wherein the n-type compound semiconductor layer has amorphous and crystals which have an average crystal grain size of at most 500 nm coexist at the site 50 nm apart from the interface between the transparent electrode and the light absorbing layer into the light absorbing layer.

13. The element according to claim 1, wherein the n-type compound semiconductor layer exists between the p-type compound semiconductor layer and the transparent electrode.

14. The cell according to claim 5, wherein the p-type compound semiconductor layer has an average crystal grain size of 1,000 nm to 3,000 nm.

15. The cell according to claim 5, wherein the n-type compound semiconductor layer has an average crystal grain size of at most 500 nm or an amorphous.

16. The cell according to claim 5, wherein
the p-type compound semiconductor layer contains Cu, selected from Al, In and Ga, and selected from Se and S,
the p-type compound semiconductor layer has a chalcopyrite structure,
the n-type compound semiconductor layer contains Cu, selected from Al, In and Ga, selected from Se and S, and selected from Cd and Zn, and
the n-type compound semiconductor layer has a chalcopyrite structure.

17. The cell according to claim 5, wherein the n-type compound semiconductor layer has amorphous and crystals which have an average crystal grain size of at most 500 nm coexist at the site 50 nm apart from the interface between the transparent electrode and the light absorbing layer into the light absorbing layer.

18. The cell according to claim 5, wherein the n-type compound semiconductor layer exists between the p-type compound semiconductor layer and the transparent electrode.

* * * * *